(12) United States Patent
Hynes et al.

(10) Patent No.: US 9,218,877 B2
(45) Date of Patent: Dec. 22, 2015

(54) DIFFERENTIAL BIT CELL

(71) Applicant: Broadcom Corporation, Irvine, CA (US)

(72) Inventors: Owen Hynes, Gilbert, AZ (US); Jonathan Schmitt, Eden Prairie, MN (US)

(73) Assignee: Broadcom Corporation, Irvine, CA (US)

( * ) Notice: Subject to any disclaimer, the term of this patent is extended or adjusted under 35 U.S.C. 154(b) by 245 days.

(21) Appl. No.: 13/924,495

(22) Filed: Jun. 21, 2013

(65) Prior Publication Data

US 2014/0376300 A1    Dec. 25, 2014

Related U.S. Application Data

(60) Provisional application No. 61/837,033, filed on Jun. 19, 2013.

(51) Int. Cl.
  *G11C 11/00* (2006.01)
  *G11C 13/00* (2006.01)
(52) U.S. Cl.
  CPC ........ *G11C 13/0069* (2013.01); *G11C 13/0002* (2013.01); *G11C 13/004* (2013.01); *G11C 2013/0042* (2013.01); *G11C 2013/0057* (2013.01)

(58) Field of Classification Search
  CPC ........... G11C 13/0069; G11C 13/0002; G11C 13/004; G11C 2013/0057; G11C 2013/0042
  USPC .......................... 365/148, 158, 163, 171, 173
  See application file for complete search history.

(56) References Cited

U.S. PATENT DOCUMENTS

| | | | |
|---|---|---|---|
| 6,493,259 B1 * | 12/2002 | Swanson | G11C 11/15 365/158 |
| 7,272,034 B1 * | 9/2007 | Chen | G11C 11/16 365/158 |

* cited by examiner

*Primary Examiner* — Tha-O H Bui
(74) *Attorney, Agent, or Firm* — Fiala & Weaver P.L.L.C.

(57) ABSTRACT

A differential bit cell includes two memory elements that are configured to have different states. Each of the two memory elements is connected to a respective switching element. Each of these switching elements may have process variances, which may result in a degradation of read and/or write margins. To mitigate the effect of such variances, another switching element is coupled to the two memory elements and their respective switching elements in a manner that couples the aforementioned switching elements in a parallel fashion. In this way, the mismatch effects between the switching elements can be negated during read operations. During programming operations, such a configuration allows for the programming of both memory elements to different states with a single current pulse and also reduces the effective resistance of the programming path.

20 Claims, 5 Drawing Sheets

DIFFERENTIAL BIT CELL

CROSS-REFERENCE TO RELATED APPLICATION(S)

This application claims the benefit of U.S. Provisional Application No. 61/837,033, filed Jun. 19, 2013, the entirety of which is incorporated by reference herein.

BACKGROUND

1. Technical Field

The subject matter described herein relates to memory devices. In particular, the subject matter described herein relates to memory devices having different resistive states.

2. Description of Related Art

The basic unit of a semiconductor memory is a memory cell. A memory cell is capable of storing a single bit of information. Industry trends continuously demand for smaller, faster, and higher capacity memories. Accordingly, the memory cell has steadily shrunk in size to enable more and more cells per unit area. In other words, memory devices have been becoming denser.

Typically, memory cells include one or two transistors. Accordingly, as memory cells decrease in size, so do the transistor(s). One problem that arises when manufacturing relatively smaller transistors is that various process variations may be introduced. For example, transistor(s) within a memory cell may vary in length, width, oxide thickness, etc. Such variances tend to negatively affect the performance of the memory cells. For example, process variations may alter the device physics such that the read and write margins are greatly diminished.

BRIEF SUMMARY

Methods, systems, and apparatuses are described for reducing the mismatch effects of transistors that are caused by process variations and improving the performance of a memory device, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 1:
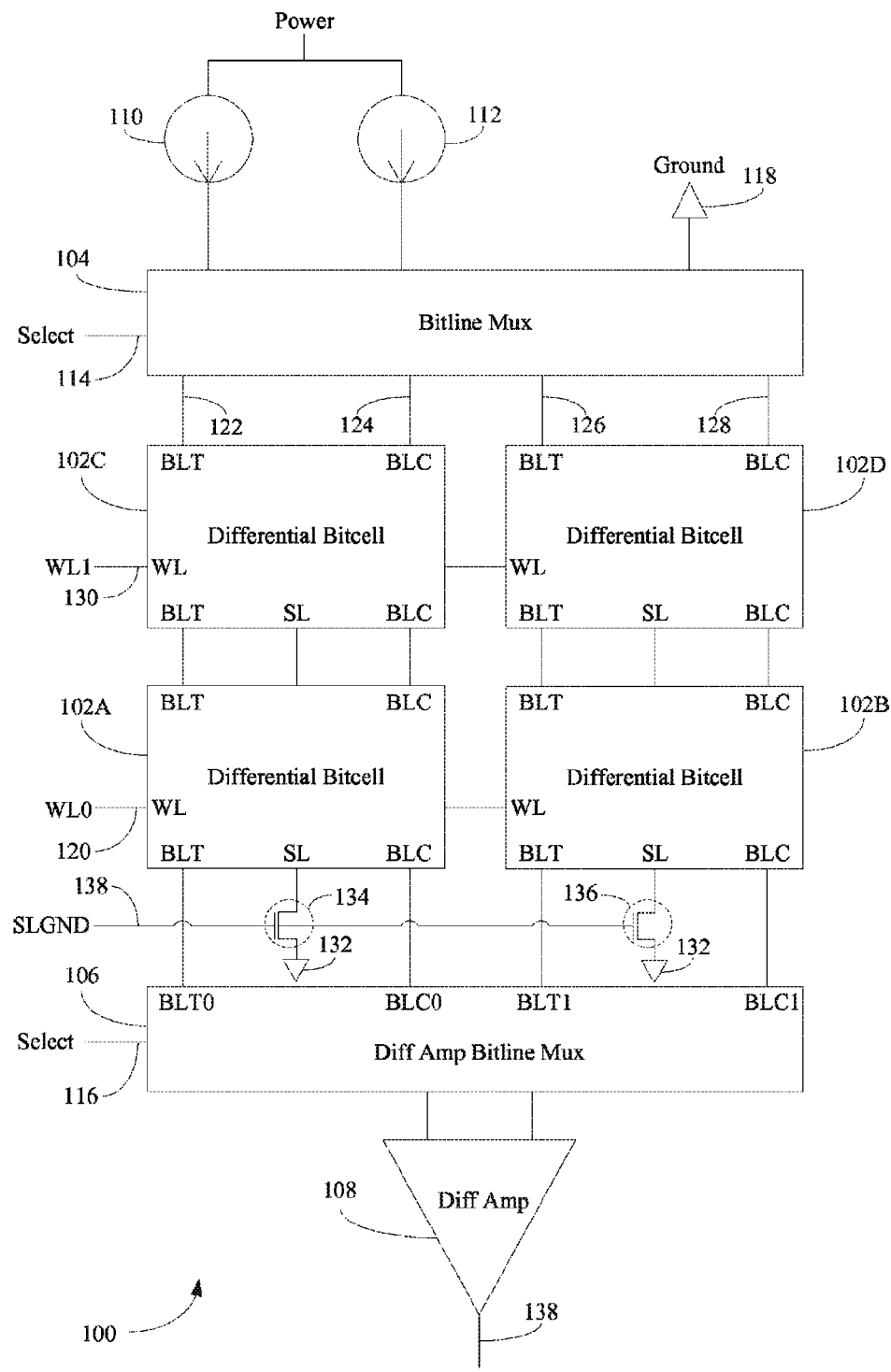
FIG. 1 is a block diagram of an example memory device in accordance with an embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Example embodiments relate to a differential bit cell that includes two memory elements that are configured to have different states. Each of the two memory elements is connected to a respective switching element. Each of these switching elements may have process variances (e.g., created during manufacturing), which may result in a degradation of read and/or write margins. To mitigate the effect of such variances, another switching element is coupled to the two memory elements and their respective switching elements in a manner that couples the aforementioned switching elements in a parallel fashion. In this way, the mismatch effects between the switching elements can be negated during read operations. During programming operations, such a configuration allows for the programming of both memory elements to different states with a single current pulse and also reduces the effective resistance of the programming path. Such benefits may advantageously allow the size of the memory bit cell to be reduced while maintaining suitable read and/or write margins.

An example differential bit cell is described. The differential bit cell includes a first memory element, a second memory element, and switching circuitry. The first memory element is configured to have a first state. The second memory element is configured to have a second state that is different than the first state. The switching circuitry is coupled to the first memory element and the second memory element. The switching circuitry includes a first switching element, a second switching element, and a third switching element. The first switching element includes a first source terminal, a first drain terminal, and a first gate terminal. The first source terminal is connected to the first memory element. The first drain terminal is connected to the second memory element. The second switching element is coupled to the first switching element and the first memory element. The third switching element is coupled to the first switching element and the second memory element.

An example method is described. The method includes programming a differential bit cell that includes a first memory element and a second memory element. Programming the differential bit cell includes providing a current pulse by a first control line coupled to the first memory element and/or a second control line coupled to the second memory element. A first predetermined voltage is provided by a third control line, which is coupled to a first gate terminal of a first switching element, to turn on the first switching element. A first source terminal of the first switching element is connected to the first memory element, and a first drain terminal of the first switching element is connected the second memory element. The first memory element is configured to be programmed to a first state and the second memory element is configured to be programmed to a second state that is different than the first state when the current pulse is provided by the first control line and the first predetermined voltage is provided by the third control line. The second memory element is configured to be programmed to the first state and the first memory element is configured to be programmed to the second state when the current pulse is provided by the second control line and the first predetermined voltage is provided by the third control line.

Another example method is described. The method includes reading a differential bit cell that includes a first memory element and a second memory element. Reading the differential bit cell includes providing a current pulse by a first control line coupled to the first memory element and/or a second control line coupled to the second memory element. A first predetermined voltage is provided by a third control line, which is coupled to a first gate terminal of a first switching element, to turn on the first switching element. A first source terminal of the first switching element is connected to the first memory element, and a first drain terminal of the first switching element is connected the second memory element. The first memory element is configured to be programmed to a first state and the second memory element is configured to be programmed to a second state that is different than the first state when the current pulse is provided by the first control line and the first predetermined voltage is provided by the third control line. The second memory element is configured to be programmed to the first state and the first memory element is configured to be programmed to the second state when the current pulse is provided by the second control line and the first predetermined voltage is provided by the third control line.

II. Example Embodiments

FIG. 1 is block diagram of an example memory device 100 in accordance with an embodiment. As shown in FIG. 1, memory device 100 includes differential bit cells 102A-102D, a bitline multiplexor (mux) 104, a differential amplifier (diff amp) bitline mux 106, a diff amp 108, a first current source 110, and a second current source 112. In the illustrated exemplary embodiment, memory device 100 includes four differential bit cells 102A-102D arranged into two rows and two columns (i.e., a 2×2 configuration) for illustrative purposes, though persons skilled in the relevant art(s) will appreciate that additional or fewer differential bit cells and/or additional or fewer rows and/or columns may be employed without departing from the spirit and scope of the present embodiments.

As will be described below with reference to FIG. 2, each of differential bit cells 102A-102D may include two memory elements. Each of the two memory elements includes an associated access transistor that serves to control the access to the respective memory element during programming operations and/or read operations that are performed with regard to differential bit cells 102A-102D. Each of differential bit cells 102A-102D includes an additional transistor that effectively places the access transistors in parallel. By doing so, mismatch effects between the access transistors that are caused by process variations are reduced during read operations, and the effective resistance of the programming path is reduced during programming operations.

The two memory elements may be programmed to have different states. For instance, a first memory element may be programmed to have a first state, and a second memory element may be programmed to have a second state that is different from the first state. In an example embodiment, the two memory elements may be programmed to have different resistive states. For example, one memory element may be programmed to have a relatively high resistive state (i.e., the resistance of the memory element is relatively high), while the other memory element may be programmed to have a relatively low resistive state (i.e., the resistance of the memory element is relatively low), or vice versa. In accordance with an embodiment, each of the two memory elements may be characterized as a magnetic tunnel junction (MTJ) of a magnetoresistive random access memory (MRAM), though other configurations and/or other resistive memories (i.e., memories that are configured to have different resistive states) may be used as would be apparent to persons skilled in the relevant art(s) having the benefit of this disclosure.

An MTJ includes two ferromagnetic layers and a thin insulating layer, which is located between the two ferromagnetic layers. In accordance with an embodiment, the thin insulating layer includes silicon oxide, aluminum oxide, magnesium oxide, and/or the like. In the MTJ, a first ferromagnetic layer has a fixed magnetization direction (referred to as a "reference layer"), and a second ferromagnetic layer has a configurable magnetization direction (referred to as a "free layer"). The magnetization direction of the free layer can be changed by passing a current through the MTJ. The relative magnetization direction of the two ferromagnetic layers determines the resistance of the MTJ (i.e., the resistive state of the MTJ). For example, if both the ferromagnetic layers have the same magnetization direction, the resistance of the MTJ is relatively low (i.e., the MTJ has a relatively low resistive state). If the two ferromagnetic layers have different magnetization directions, the resistance of the MTJ is relatively high (i.e., the MTJ has a relatively high resistive state). In accordance with an embodiment, a relatively low resistive state corresponds to a logical '0', and a relatively high resistive state corresponds to a logical '1'.

Each of differential bit cells 102A-102D is configured to receive a plurality of control signals via a plurality of signal lines that are used to program and/or read differential bit cells 102A-102D. For example, differential bit cell 102A is configured to receive a first wordline control signal via first wordline (WL0) 120 and first bitline control signals via a first differential pair of bitlines (i.e., bitline (BLT) 122 and bitline compliment (BLC) 124). Differential bit cell 102B is configured to receive the first wordline control signal via WL0 120 and second bitline control signals via a second differential pair of bitlines (i.e., BLT 126 and BLC 128). Differential bit cell 102C is configured to receive a second wordline control signal via second wordline (WL1) 130 and the first bitline control signals via the first pair of bitline signals BLT 122 and BLC 124. Differential bit cell 102D is configured to receive the second wordline signal via WL1 130 and the second bitline control signals via the second differential pair of bitlines BLT 126 and BLC 128.

Each of differential bit cells 102A-102D is also configured to be coupled to a ground potential 132. Differential bit cells 102A and 102C are configured to be coupled to ground potential 132 via switching element 134, and differential bit cells 102B and 102D are configured to be coupled to ground potential 132 via switching element 136. To couple differential bit cells 102A and 102C to ground potential 132, a control signal that turns on switching element 134 is provided to switching element 134 via a source line ground control line (SLGND) 138. To couple differential bit cells 102B and 102D to ground potential 132, a control signal that turns on switching element 136 is provided to switching element 136 via SLGND 138. In an embodiment, switching elements 134 and 136 are n-channel metal oxide semiconductor field effect transistors (MOSFETs) (as depicted in FIG. 1). In accordance with this embodiment, switching elements 134 and 136 are turned on when the control signal provided via SLGND 138 is asserted high (e.g., a '1' (logical high signal value)). In another embodiment, switching elements 134 and 136 are p-channel MOSFETs. In accordance with this embodiment, switching elements 134 and 136 are turned on when the control signal provided via SLGND 138 is asserted low (e.g., a '0' (logical low signal value)).

In an embodiment in which differential bit cells 102A-102D are differential MRAM bit cells, each of differential bit cells 102A-102D is configured to be programmed and/or read by selecting the appropriate differential bit cell using first and second wordline signals received via WL0 120 and WL1 130, respectively, and applying a respective current pulse to each of the differential pairs of bitlines coupled to the differential bit cell to be programmed and/or read. In accordance with this embodiment, the first and second bitline control signals are current pulses. The current pulses may be provided by current source 110 and current source 112.

WL0 120 and WL1 130 may be configured to select a particular differential bit cell for programming and/or reading based on a row address received by memory device 100. The first differential pair of bitlines BLT 122 and BLC 124 and the second differential pair of bitlines BLT 126 and BLC 128 may be configured to select a particular differential bit cell for programming and/or reading based on a column address received by memory device 100. Accordingly, the first wordline signal received via WL0 120 is used to select a first row of differential bit cells for programming and/or reading, and the second wordline signal received via WL1 130 is used to select a second row of differential bit cells for programming and/or reading. The first row includes differential bit cells 102A-102B. The second row includes differential bit cells 102C-102D. Bitline mux 104 is configured to couple current source 110, current source 112 and/or ground potential 118 to the appropriate differential pair of bitlines based on a control signal received via select line 114.

For example, when programming and/or reading differential bit cell 102A, first wordline signal received via WL0 120 may be asserted high, second wordline signal received via WL1 130 may be asserted low, and the control signal received via select line 114 may be asserted low, which may cause bitline mux 104 to couple current sources 110 and 112 to the first differential pair of bitlines BLT 122 and BLC 124, respectively, and to couple ground potential 118 to the second differential pair of bitlines BLT 126 and BLC 128. When programming and/or reading differential bit cell 102B, first wordline signal received via WL0 120 may be asserted high, second wordline signal received via WL1 130 may be asserted low, and the control signal received via select line 114 may be asserted high, which may cause bitline mux 104 to couple current sources 110 and 112 to the second differential pair of bitlines BLT 126 and BLC 128, respectively, and to couple ground potential 118 to the first differential pair of bitlines BLT 122 and BLC 124. When programming and/or reading differential bit cell 102C, first wordline signal received via WL0 120 may be asserted low, second wordline signal received via WL1 130 may be asserted high, and the control signal received via select line 114 may be asserted low, which may cause bitline mux 104 to couple current sources 110 and 112 to the first differential pair of bitlines BLT 122 and BLC 124, respectively, and to couple ground potential 118 to the second differential pair of bitlines BLT 126 and BLC 128. When programming and/or reading differential bit cell 102D, first wordline signal received via WL0 120 may be asserted low, second wordline signal received via WL1 130 may be asserted high, and the control signal received via select line 114 may be asserted high, which may cause bitline mux 104 to couple current sources 110 and 112 to the second differential pair of bitlines BLT 126 and BLC 128, respectively, and to couple ground potential 118 to the first differential pair of bitlines BLT 122 and BLC 124.

As will be described below with reference to FIG. 2, when reading a particular differential bit cell, the control signal received via SLGND 138 may be asserted high so that the particular differential bit cell is coupled to ground potential 132. When programming a particular differential bit cell, the control signal received via SLGND 138 may be asserted low so that the particular differential bit cell is not coupled to ground potential 132, thereby enabling a potential on the corresponding SL input of the particular differential bit cell to float.

During a read operation, diff amp bitline mux 106 may be configured to couple the differential pair of bitlines from the differential bit cell being read to diff amp 108 based on a control signal received via select line 116. For example, when reading differential bit cell 102A or 102C, the control signal received via select line 116 may be asserted low, which may cause diff amp bitline mux 106 to couple the first pair of differential bitlines BLT 122 and BLC 124 to diff amp 108. When reading differential bit cell 102B or 102D, the control signal received via select line 116 may be asserted high, which may cause diff amp bitline mux 106 to couple the second pair of differential bitlines BLT 126 and BLC 128 to diff amp 108. In an embodiment, the control signal received via select line 116 is the same control signal received via select line 114. In another embodiment, the control signal received via select line 116 is different than the control signal received via select line 114.

During a read operation, diff amp 108 is configured to sense the voltages received via the differential pair of bitlines coupled thereto. In particular, diff amp 108 is configured to sense a first voltage from a first bitline of the differential pair of bitlines and to sense a second voltage from a second bitline of the differential pair of bitlines. Diff amp 108 also may be configured to determine a difference between the first voltage and the second voltage, amplify the determined difference, and/or provide the determined difference via signal line 138. A digital value associated with the differential bit cell being read may be determined based on the determined difference. For example, if the determined difference reaches or exceeds a predetermined threshold, then it may be determined that the digital value associated with the particular differential bit cell being read corresponds to a logical '1'. If the determined difference does not reach the predetermined threshold, then it may be determined that the digital value associated with the particular differential bit cell being read corresponds to a logical '0'.

Figure 2:
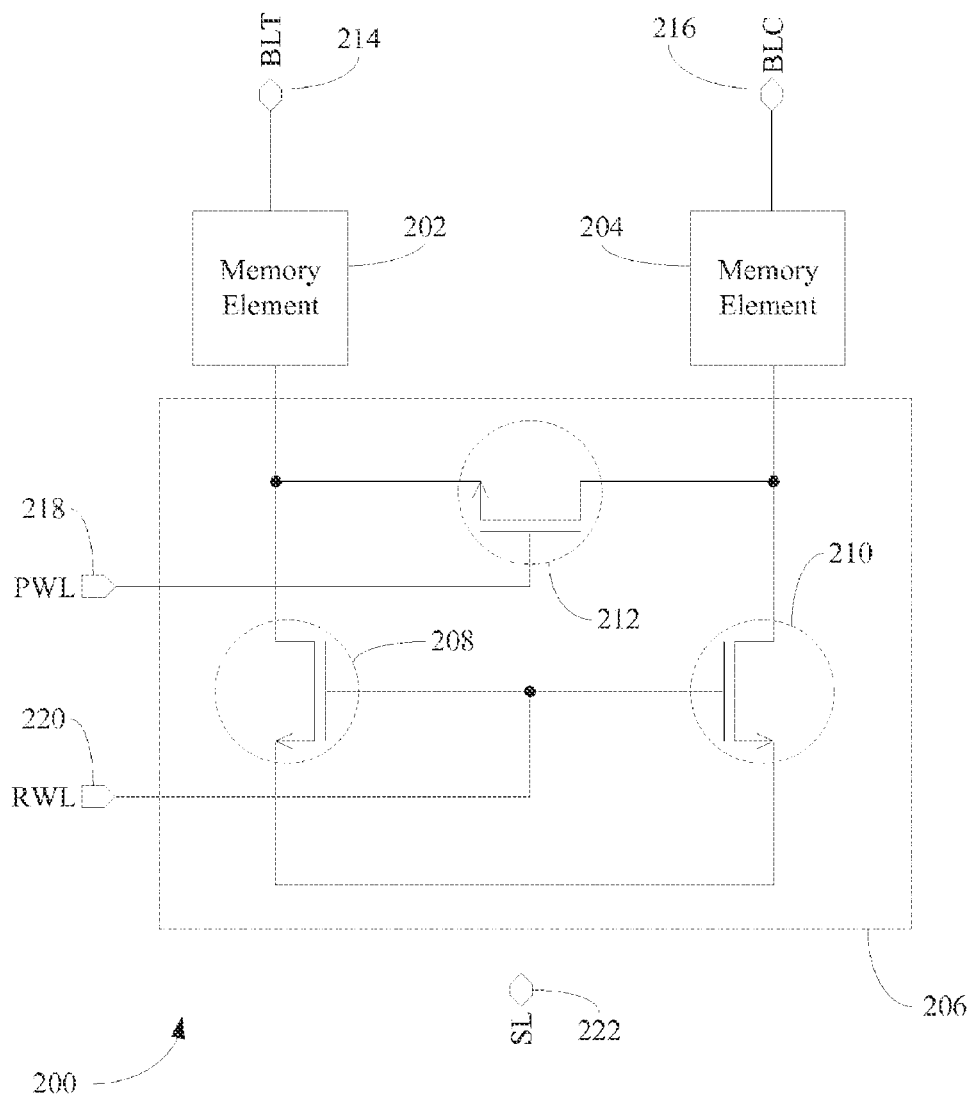
FIG. 2 is a circuit diagram of a differential bit cell in accordance with an embodiment.

FIG. 2 is a circuit diagram of a differential bit cell 200 in accordance with an embodiment. Differential bit cell 200 may be an example of one of differential bit cells 102A-102D described above with respect to FIG. 1. As shown in FIG. 2, differential bit cell 200 includes a first memory element 202, a second memory element 204, and switching circuitry 206. Differential bit cell 200 is connected to a differential pair of bitlines BLT 214 and BLC 216, a program wordline (PWL) 218, a read wordline (RWL) 220, and a common source line (SL) 222. In accordance with embodiment, differential bit cell 200 is a magnetoresistive random access memory (MRAM) bit cell, and first memory element 202 and second memory element 204 are MTJs, though other configurations and/or other resistive memories (i.e., memories that are configured to have different resistive states) may be used as would be apparent to persons skilled in the relevant art(s) having the benefit of this disclosure.

As further shown in FIG. 2, switching circuitry 206 includes a first switching element 208, a second switching element 210, and a third switching element 212. In accordance with an embodiment, each of first switching element 208, second switching element 210, and third switching element 212 is a transistor. For example, as shown in FIG. 2, each of first switching element 208, second switching element 210, and third switching element is depicted as an n-channel MOSFET. It will be recognized that any one or more of switching elements 208, 210, and/or 212 may be a p-channel MOSFET.

Each of first switching element 208, second switching element 210, and third switching element 212 includes a source terminal, a drain terminal, and a gate terminal. The source terminal of first switching element 208 is connected to SL 222, and the drain terminal of first switching element 208 is connected to the first memory element 202. First switching element 208 may be referred to as an "access" transistor because it is configured to control access to first memory element 202 during programming and/or read operations. The source terminal of second switching element 210 is connected to SL 222, and the drain terminal of second switching element 210 is connected to second memory element 204. The respective gate terminals of first switching element 208 and second switching element 210 are connected to RWL 220. Second switching element 210 may also be referred to as an "access" transistor because it is configured to control access to second memory element 204 during programming and/or read operations.

In an embodiment, the source terminal of third switching element 212 is connected to first memory element 202 and the drain terminal of first switching element 208, and the drain terminal of third switching element 212 is connected to second memory element 204 and the drain terminal of second switching element 210, as shown in FIG. 2. In another embodiment, the drain terminal of third switching element 212 is connected to first memory element 202 and the drain terminal of first switching element 208, and the source terminal of third switching element 212 is connected to second memory element 204 and the drain terminal of second switching element 210. The gate terminal of third switching element 212 is connected to PWL 218.

To read a value stored by differential bit cell 200, a predetermined voltage may be applied via RWL 220, which causes first switching element 208 and second switching element 210 to be turned on, and a predetermined voltage may be applied via PWL 220 that causes third switching element 212 to be turned on. SL 222 is also coupled to a ground potential (e.g., as shown in FIG. 1). Thereafter, a current pulse is applied to each of BLT 214 and BLC 216. Both current pulses may have the same amplitude and polarity and may be applied simultaneously to BLT 214 and BLC 216. After both current pulses are applied to BLT 214 and BLC 216, a first voltage is sensed from BLT 214, and a second voltage is sensed from BLT 216. The first voltage is based at least in part on the resistive state of first memory element 202 and on the current pulse that is applied to BLT 214 flowing through a combination in which first switching element 208 is coupled in parallel with second switching element 210 and third switching element 212. The second voltage is based at least in part on the resistive state of second memory element 204 and on the current pulse that is applied to BLC 216 flowing through a combination in which second switching element 210 is coupled in parallel with first switching element 208 and third switching element 212. After sensing the first and second voltages, a difference between the first and second voltages is determined by a diff amp (e.g., diff amp 108, as shown in FIG. 1). A digital value associated with differential bit cell 200 may be determined based on the determined difference.

Third switching element 212 provides benefits for read operations with regard to differential bit cell 200. For example, third switching element 212 effectively places first switching element 208 and second switching element 210 in parallel. By doing so, the mismatch effects due to process variations between first switching element 208 and second switching element 210 may be reduced or negated. The reduction or negation of mismatch effects becomes apparent in view of the Equations described below. It is noted that first switching element 208, second switching element 210, and third switching element 212 operate in the linear region. As such, each of first switching element 208, second switching element 210, and third switching element 212 may be modeled as resistors, and are represented as such in the following Equations.

Equation 1 represents the differential voltage determined via BLT 214 and BLC 216 in an embodiment that does not include third switching element 212 in differential bit cell 200:

$$V_{BTL} - V_{BLC} = I \times (R_{M1} - R_{M2}) + I \times (R1 - R2), \qquad \text{Equation 1}$$

where $V_{BTL}$=the first voltage sensed from BLT 214, $V_{BLC}$=the second voltage sensed from BLT 216, $R_{M1}$=the resistance measured across first memory element 202, $R_{M2}$=the resistance measured across second memory element 204, R1=the resistance measured across first switching element 208, R2=the resistance measured across second switching element 210, and I=the current applied to BLT 214 and BLT 216.

In an ideal situation, if there are no process variations between first switching element 208 and second switching element 210, Equation 1 becomes:

$$V_{BTL} - V_{BLC} = I \times (R_{M1} - R_{M2}), \qquad \text{Equation 2}$$

because R1 and R2 will have the same resistance and cancel each other out. However, if process variations exist between first switching element 208 and second switching element 210, the differential voltage (i.e., $V_{BTL} - V_{BLC}$) will be altered, possibly resulting in an incorrect reading for the differential voltage.

In contrast, when configuring differential bit cell 200 as shown in FIG. 2 (i.e., by adding third switching element 212), the differential voltage is determined in accordance with the following Equation:

$$V_{BTL} - V_{BLC} = I \times (R_{M1} - R_{M2}) + \left( I \times \frac{R3 \times (R1 - R2)}{R1 + R2 + R3} \right), \qquad \text{Equation 3}$$

where R3=the resistance measured across third switching element 212.

As such, if process variation(s) exist between first switching element 208 and second switching element 210 (i.e., R1 and R2 have different resistances), the difference in variation is dampened by the ratio shown in Equation 4 below:

$$\frac{R3}{R1+R2+R3}. \quad\quad \text{Equation 4}$$

In other words, if there is a mismatch between first switching element 208 and second switching element 210, the mismatch is reduced because the ratio of Equation 4 will always be less than 1.

Third switching element 212 also provides benefits for programming operations with regard to differential bit cell 200. For example, third switching element 212 advantageously enables the programming of both first memory element 202 and second memory element 204 to opposite states (e.g., first memory element 202 may be configured to be in a relatively low resistive state, and second memory element 204 may be configured to be in a relatively high resistive state, or vice versa) with a single current pulse. For instance, to program differential bit cell 200, a predetermined voltage is applied to RWL 220 that causes first switching element 208 and second switching element 210 to be turned on, and a predetermined voltage is applied to PWL 218 that causes third switching element 212 to be turned on.

To program differential bit cell 200 to a logical '1' value, a single current pulse is applied to BLT 214. The single current pulse flows through first memory element 202 and reverses the magnetization direction of the free layer of the MTJ of first memory element 202 such that the magnetization direction of the free layer and the reference layer of the MTJ are the same direction, thereby putting first memory element 202 in a relatively low resistive state. In an embodiment in which SL 222 is coupled to a ground potential, the single current pulse flows through third switching element 212, then through second memory element 204. When the single current pulse flows through second memory element 204, the magnetization direction of the free layer of the MTJ of second memory element 204 is reversed such that the magnetization direction of the free layer and the reference layer of the MTJ are different directions, thereby putting first memory element in a relatively high resistive state. The single current pulse then flows to BLC 216. Thus, the resistive states for both first memory element 202 and second memory element 204 are changed, and differential bit cell 200 is programmed to a logical '1' value by applying a single current pulse to BLT 214.

To program differential bit cell 200 to a logical '0' value, a single current pulse is applied to BLC 216. Thus, the direction of the single current pulse is reversed. Accordingly, the single current pulse flows through second memory element 204 and reverses the magnetization direction of the free layer of the MTJ of second memory element 204 such that the magnetization direction of the free layer and the reference layer of the MTJ are the same direction, thereby putting second memory element 204 in a relatively low resistive state. In an embodiment in which SL 222 is coupled to a ground potential, the single current pulse flows through third switching element 212, and then flows through first memory element 202. When the current pulse flows through first memory element 202, the magnetization direction of the free layer of the MTJ of first memory element 202 is reversed such that the magnetization direction of the free layer and the reference layer of the MTJ are in different directions, thereby putting first memory element 202 in a relatively high resistive state. The single current pulse then flows to BLC 216. Thus, the resistive states for both first memory element 202 and second memory element 204 are changed, and differential bit cell is programmed to a logical '0' value by applying a single current pulse to BLC 216.

In an embodiment in which SL 222 is not connected to a ground potential, thereby enabling a potential on SL 222 to float, third switching element 212 provides additional benefits when performing a programming operation to differential bit cell 200. In particular, the resistance in the programming path is reduced when compared to an embodiment of differential bit cell 200 that does not include third switching element 212. This is so because now the single current pulse (either applied to BLT 214 or BLC 216 depending on the value intended to be programmed for differential bit cell 200) flows through either a first combination in which the first switching element 208 is coupled in parallel with second switching element 210 and third switching element 212 (when applying the single current pulse to BLT 214) or a second combination in which second switching element 210 is coupled in parallel with first switching element 208 and third switching element 212 (when applying the single current pulse to BLC 216). The reduction of the resistance in the programming path becomes apparent in view of the Equations described below. As described above, first switching element 208, second switching element 210, and third switching element 212 may operate in the linear region. As such, each of first switching element 208, second switching element 210, and third switching element 212 may be modeled as a resistor, and is represented as such in the following Equations.

Equation 5 represents the resistance in the programming path in an embodiment that does not include third switching element 212 in differential bit cell 200:

$$R1+R2 \quad\quad \text{Equation 5}$$

where
R1=the resistance measured across first switching element 208, and
R2=the resistance measured across second switching element 210.

However, when configuring differential bit cell 200 as shown in FIG. 2 (i.e., by adding third switching element 212), the resistance in the programming path is determined in accordance to the following Equation:

$$\frac{R3 \times (R1+R2)}{R1+R2+R3}, \quad\quad \text{Equation 6}$$

where R3=the resistance measured across third switching element 212.

As such, the resistance in the programming path is reduced by the ratio shown in Equation 7 below:

$$\frac{R3}{R1+R2+R3}. \quad\quad \text{Equation 7}$$

In other words, because the ratio of Equation 7 is less than one, the resistance of the programming path of a differential bit cell that includes third switching element 212 as shown in FIG. 2, is less than the resistance of the programming path of an embodiment in which third switching element 212 is not included.

Some example methods for operations performed by a differential bit cell (e.g., differential bit cell 200) during a read operation will now be described with reference to flowcharts 300, 400, and 500 of respective FIGS. 3, 4, and 5 in accordance with embodiments herein. These methods are described by way of example only and are not intended to limit the scope of the embodiments described herein. Flowcharts 300 and 400 may be performed by differential bit cell 200 shown in FIG. 2, and therefore, is described with respect to FIG. 2 for illustrative purposes. Flowchart 500 may be performed by diff amp 108, and therefore, is described with respect to FIG. 1 for illustrative purposes. Further structural and operational embodiments will be apparent to persons skilled in the relevant art(s) based on the discussion regarding flowcharts 300, 400, and 500.

Figure 3:
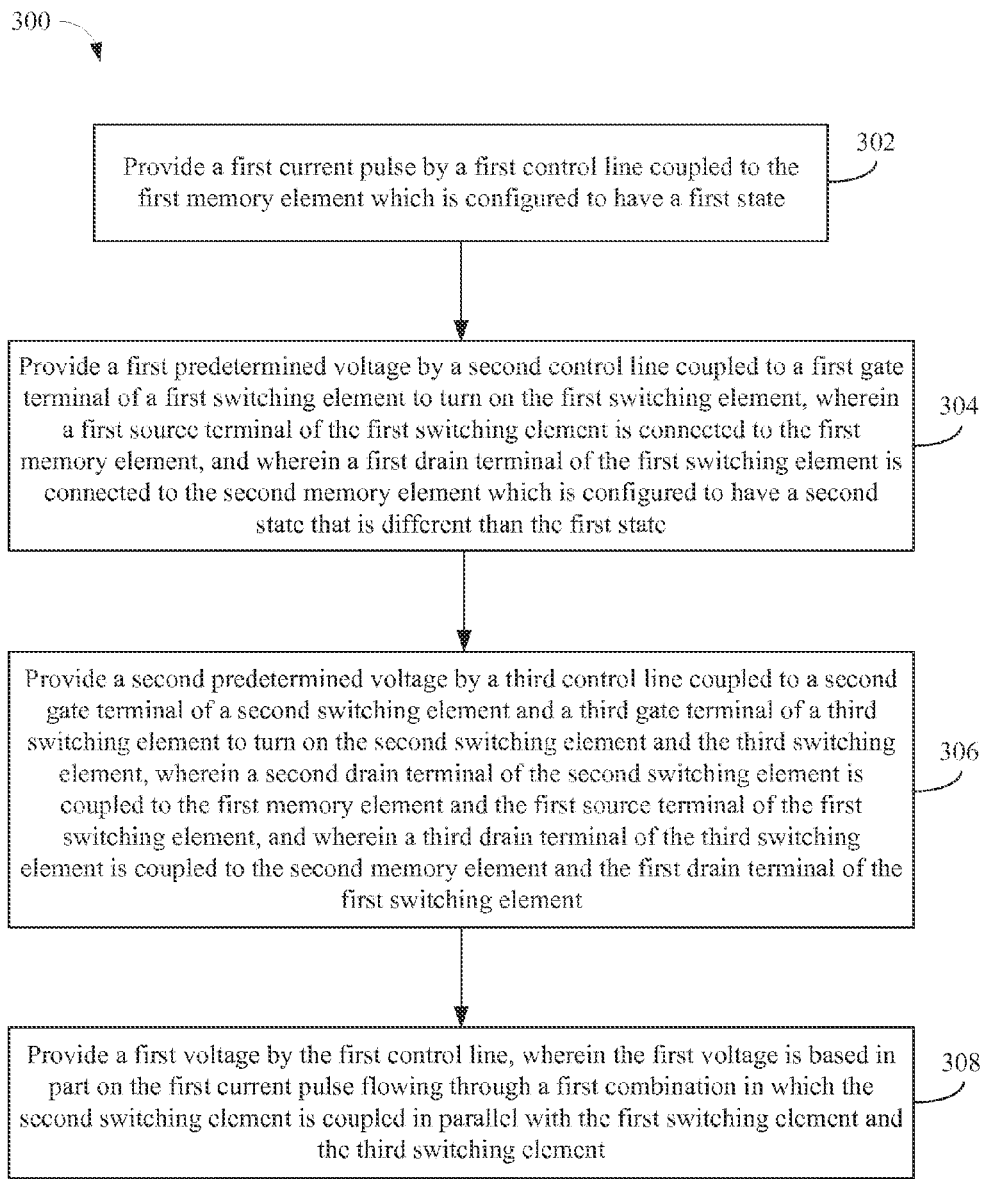
FIGS. 3-5 are flowcharts of example methods for operations performed by a differential bit cell during a read operation in accordance with embodiments.

FIG. 3 is a flowchart 300 of an example method that may be used to provide a first voltage from a first control line of a differential bit cell (e.g., differential bit cell 200) in accordance with an embodiment. As shown in FIG. 3, the method of flowchart 300 begins at step 302 in which a first current pulse is provided by a first control line coupled to a first memory element that is configured to have a first state. For example, as shown in FIG. 2, the first current pulse may be provided by BLT 214, which is coupled to first memory element 202. First memory element 202 is configured to have a first state. In accordance with an embodiment, the first state is a first resistive state.

At step 304, a first predetermined voltage is provided by a second control line coupled to a first gate terminal of a first switching element to turn on the first switching element. A first source terminal of the first switching element is connected to first memory element 202, and a first drain terminal of the first switching element is connected to a second memory element that is configured to have a second state that is different that the first state. For example, as shown in FIG. 2, the first predetermined voltage may be received by PWL 218, which is coupled to the gate terminal of third switching element 212 to turn on third switching element 212. As further shown in FIG. 2, the source terminal of third switching element 212 is connected to first memory element 202, and the drain terminal of third switching element 212 is connected to second memory element 204. Second memory element 204 is configured to have a second state that is different than the first state. In accordance with an embodiment, the second state is a second resistive state that is different than the resistive state of first memory element 202.

At step 306, a second predetermined voltage is provided by a third control line coupled to a second gate terminal of a second switching element and a third gate terminal of a third switching element to turn on the second switching element and the third switching element. The second switching element has a second drain terminal that is coupled to the first memory element and the first source terminal of the first switching element. A third drain terminal of the third switching element is coupled to the second memory element and the first drain terminal of the first switching element. For example, as shown in FIG. 2, a second predetermined voltage may be provided by RWL 220, which is coupled to the gate terminal of first switching element 208 and second switching element 210, to turn on first switching element 208 and second switching element 210. As further shown in FIG. 2, the drain terminal of first switching element 208 is coupled to first memory element 202 and the source terminal of third switching element 212, and the drain terminal of second switching element 210 is coupled to second memory element 204 and the drain terminal of third switching element 212.

In an embodiment, at least one of first switching element 208, second switching element 210, and third switching element 212 is a transistor. For example, as shown in FIG. 2, first switching element 208, second switching element 210, and third switching element 212 are n-channel MOSFETs. However, in accordance with other embodiments, at least one of first switching element 208, second switching element 210, and third switching element 212 is a p-channel MOSFET.

At step 308, a first voltage is provided by the first control line, where the first voltage is based in part on the first current pulse flowing through a first combination in which the second switching element is coupled in parallel with the first switching element and the third switching element. For example, as shown in FIG. 2, the first voltage may be provided via BLT 214 and is based in part on the first current pulse flowing through a combination in which first switching element 208 is coupled in parallel with the second switching element 210 and the third switching element 212.

Figure 4:
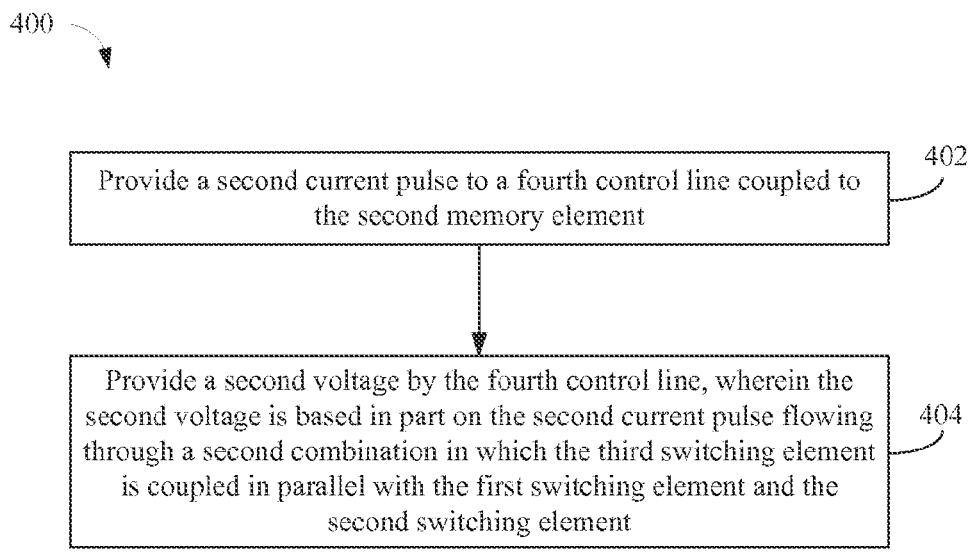

FIG. 4 is a flowchart 400 of a method that may be used to provide a second voltage from a second control line of a differential bit cell (e.g., differential bit cell 200) in accordance with an embodiment. As shown in FIG. 4, the method of flowchart 400 begins at step 402 in which a second current pulse is provided by a fourth control line coupled to the second memory element. For example, as shown in FIG. 2, the second current pulse may be provided by BLC 216, which is coupled to second memory element 204.

At step 404, a second voltage is provided by the fourth control line, where the second voltage is based in part on the second current pulse flowing through a second combination in which the third switching element is coupled in parallel with the first switching element and the second switching element. For example, as shown in FIG. 2, the second voltage may be provided by BLC 216 and is based in part on the second current pulse flowing through a combination in which the second switching element 210 is coupled in parallel with first switching element 208 and third switching element 212.

Figure 5:
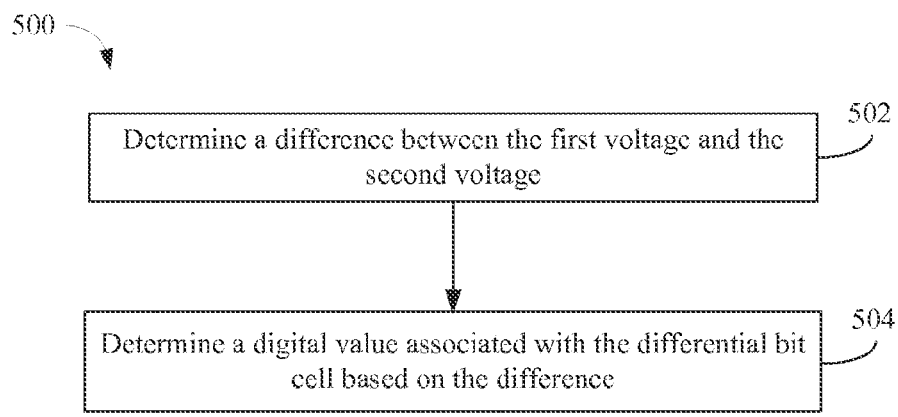

FIG. 5 is a flowchart 500 of a method that may be used to determine a value associated with a differential bit cell (e.g., differential bit cell 200) in accordance with an embodiment herein. As shown in FIG. 5, the method of flowchart 500 begins at step 502 in which a difference is determined between the first voltage and the second voltage. For example, as shown in FIG. 1, diff amp 108 determines the difference between the first voltage sensed from the appropriate pair of differential bitlines (i.e., either the first pair of differential bitlines BLT 122 and BLC 124 or the second pair of differential bitlines BLT 126 and BLC 128). The difference is provided via signal line 138.

At step 504, a digital value associated with the differential bit cell is determined based on the difference. For example, if the determined difference reaches or exceeds a predetermined threshold, then it may be determined that the value associated with differential bit cell 200 corresponds to a logical '1'. If the determined difference does not reach the predetermined threshold, then it may be determined that the value associated with differential bit cell 200 corresponds to a logical '0'.

Some example methods for performing programming operations for a differential bit cell (e.g., differential bit cell 200) will now be described with reference to flowcharts 600 and 700 of respective FIGS. 6 and 7 in accordance with embodiments herein. These methods are described by way of example only and are not intended to limit the scope of the embodiments described herein. Flowcharts 600 and 700 may be performed by memory device 100 shown in FIG. 1 and/or differential bit cell 200 shown in FIG. 2, and therefore, are described with respect to FIGS. 1 and 2 for illustrative purposes. Further structural and operational embodiments will be apparent to persons skilled in the relevant art(s) based on the discussion regarding flowcharts 600 and 700.

Figure 6:
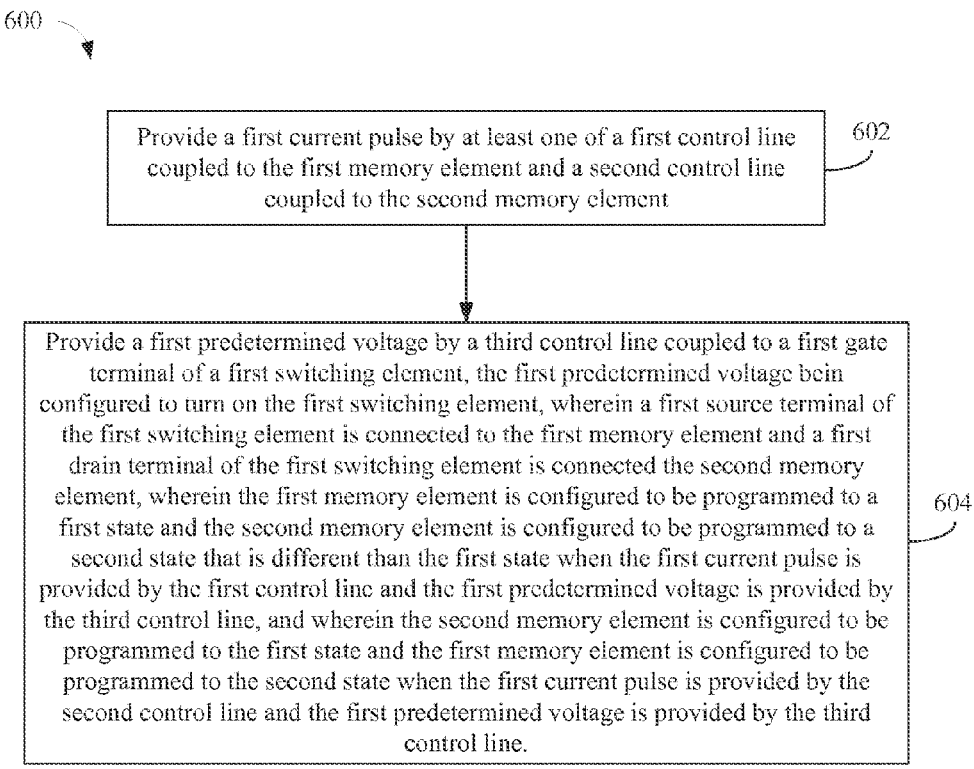
FIGS. 6 and 7 are flowcharts of example methods for performing programming operations for a differential bit cell in accordance with embodiments.

FIG. 6 is a flowchart 600 of a method that may be used to change the state of a first memory element and a second memory element of a differential bit cell (e.g., differential bit cell 200) using a single current pulse in accordance with an embodiment. As shown in FIG. 6, the method of flowchart 600 begins at step 602 in which a current pulse is provided by at least one of a first control line coupled to the first memory element and a second control line coupled to the second memory element. For example, as shown in FIG. 2, the current pulse may be provided by BLT 214, which is coupled to first memory element 202, or by BLC 216, which is coupled to second memory element 204.

At step 604, a first predetermined voltage is provided by a third control line coupled to a first gate terminal of a first switching element. The first predetermined voltage is configured to turn on the first switching element. A first source terminal of the first switching element is connected to the first memory element and a first drain terminal of the first switching element is coupled to the second memory element. The first memory element is configured to be programmed to a first state and the second memory element is configured to be programmed to a second state that is different than the first state when the current pulse is provided by the first control line and the first predetermined voltage is provided by the third control line. The second memory element is configured to be programmed to the first state and the first memory element is configured to be programmed to the second state when the current pulse is provided by the second control line and the first predetermined voltage is provided by the third control line.

For example, as shown in FIG. 2, the first predetermined voltage may be provided by PWL 218, which is coupled to the gate terminal of third switching element 212, to turn on third switching element 212. As further shown in FIG. 2, the source terminal of third switching element 212 is connected to first memory element 202, and the drain terminal of third switching element 212 is connected to second memory element 204. First memory element 202 may be configured to be programmed to a first state and second memory element 204 may be configured to be programmed to a second state that is different than the first state when the current pulse is provided by BLT 214 and the first predetermined voltage is provided by PWL 218. Second memory element 204 may be configured to be programmed to the first state and first memory element 202 may be configured to be programmed to the second state when the current pulse is received by BLC 216 and the first predetermined voltage is provided by PWL 218.

Figure 7:
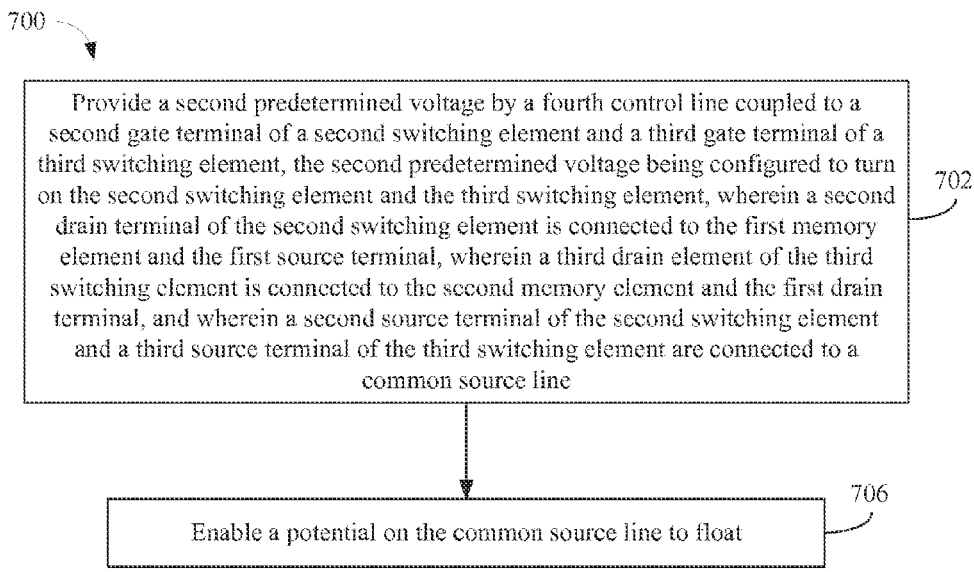

FIG. 7 is a flowchart 700 of a method to reduce the resistance in the programming path when performing a programming operation with regard to a differential bit cell (e.g., differential bit cell 200) in accordance with an embodiment herein. As shown in FIG. 7, the method of flowchart 700 begins at step 702 in which a second predetermined voltage is provided by a fourth control line coupled to a second gate terminal of a second switching element and a third gate terminal of a third switching element. A second drain terminal of the second switching element is connected to the first memory element and the first source element. A third drain element of the third switching element is connected to the second memory element and the first drain terminal. A second source terminal of the second switching element and a third source terminal of the third switching element are connected to a common source line.

For example, as shown in FIG. 2, the second predetermined voltage may be provided by RWL 220, which is coupled to the gate terminals of first switching element 208 and second switching element 210. The second predetermined voltage is configured to turn on first switching element 208 and second switching element 210. As further shown in FIG. 2, the drain terminal of first switching element 208 is connected to first memory element 202 and the source terminal of third switching element 212, the drain terminal of second switching element 210 is connected to second memory element 204 and the drain terminal of third switching element 212, and the source terminals of first switching element 208 and second switching element 210 are connected to SL 222.

At step 704, a potential on the common source line is enabled to float. For example, as shown in FIG. 1, a control signal may be received via SLGND 138 that causes the appropriate switching element (i.e., switching element 134 or switching element 136) to be de-activated, thereby enabling a potential on SL 222 to float. By doing so, the resistance of the programming path may be reduced, as the current pulse (applied to either BLT 214 or BLC 216 depending on the value intended to be programmed for differential bit cell 200) flows through first switching element 208, second switching element 210, and third switching element 212 in a parallel fashion.

III. Other Example Embodiments

Embodiments described herein may generally be used with any type of memory that is configured to have a plurality of resistive states. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

Whether the memory is integrated into a device with other circuits or provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including devices with the same type of memory, devices with different types of memory, and/or devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments may be used with multiple types of memory or with a memory which is included on a device with multiple other types of memory. The memory types may include a non-volatile memory. Nonvolatile memory types may include magnetic RAM (MRAM), flash memory, resistive RAM (RRAM), ferroelectric RAM (FeRAM), phase-change RAM (PRAM), and/or the like.

IV. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A differential bit cell comprising:
  a first memory element configured to have a first state;
  a second memory element configured to have a second state that is different than the first state; and
  switching circuitry coupled to the first memory element and the second memory element, the switching circuitry comprising:
    a first switching element comprising a first source terminal, a first drain terminal, and a first gate terminal, the first source terminal being connected to the first memory element, and the first drain terminal being connected to the second memory element;
    a second switching element coupled to the first switching element and the first memory element; and
    a third switching element coupled to the first switching element and the second memory element, wherein a fourth switching element selectively couples a ground potential to the second switching element and the third switching element.

2. The differential bit cell of claim 1, wherein the second switching element comprises a second source terminal, a second drain terminal, and a second gate terminal,
  wherein the third switching element comprises a third source terminal, a third drain terminal, and a third gate terminal,
  wherein the second drain terminal is connected to the first source terminal and the first memory element,
  wherein the third drain terminal is connected to the first drain terminal and the second memory element, and
  wherein the second source terminal and the third source terminal are coupled to a common source line.

3. The differential bit cell of claim 2, wherein the first memory element and the second memory element are configured to be programmed by application of a first current pulse to either a first control line coupled to the first memory element or a second control line coupled to the second memory element and further by application of a first predetermined voltage to a third control line coupled to the first gate terminal, the first predetermined voltage configured to turn on the first switching element.

4. The differential bit cell of claim 3, wherein the first control line and the second control line are a differential pair of bitlines configured to select the differential bit cell based on a column address.

5. The differential bit cell of claim 3, wherein the first memory element and the second memory element are configured to be programmed to the first state and the second state respectively in response to the first current pulse being applied to the first control line and further in response to the first predetermined voltage being applied to the third control line; and
  wherein the first memory element and the second memory element are configured to be programmed to the second state and the first state respectively in response to the first current pulse being applied to the second control line and further in response to the first predetermined voltage being applied to the third control line.

6. The differential bit cell of claim 5, wherein the first memory element and the second memory element are configured to be programmed further by application of a second predetermined voltage to a fourth control line coupled to the second gate terminal and the third gate terminal and further by enabling a potential on the common source line to float, the second predetermined voltage configured to turn on the second switching element and the third switching element.

7. The differential bit cell of claim 6, wherein the third control line and the fourth control line are wordlines configured to select the differential bit cell based on a row address.

8. The differential bit cell of claim 6, wherein the differential bit cell is configured to provide a first voltage at the first control line during a read operation in response to a second current pulse being applied to the first control line, further in response to the first predetermined voltage being applied to the third control line, and further in response to the second predetermined voltage being applied to the fourth control line; and
  wherein the first voltage is based in part on the second current pulse flowing through a first combination in which the second switching element is coupled in parallel with the first switching element and the third switching element.

9. The differential bit cell of claim 8, wherein the differential bit cell is configured to provide a second voltage at the second control line during a read operation in response to a third current pulse being applied to the second control line, further in response to the first predetermined voltage being applied to the third control line, and further in response to the second predetermined voltage being applied to the fourth control line; and
  wherein the second voltage is based in part on the third current pulse flowing through a second combination in which the third switching element is coupled in parallel with the first switching element and the second switching element.

10. The differential bit cell of claim 1, wherein at least one of the first switching element, the second switching element, or the third switching element is a transistor.

11. The differential bit cell of claim 1, wherein the first state and the second state are different resistive states.

12. A method comprising:
  programming a differential bit cell that includes a first memory element and a second memory element, said programming comprising:
    providing a current pulse by at least one of a first control line coupled to the first memory element and a second control line coupled to the second memory element;
    providing a first predetermined voltage by a third control line coupled to a first gate terminal of a first switching element, the first predetermined voltage being configured to turn on the first switching element, wherein a first source terminal of the first switching element is connected to the first memory element and a first drain terminal of the first switching element is connected the second memory element, wherein the first memory element is configured to be programmed to a first state and the second memory element is configured to be programmed to a second state that is different than the first state when the current pulse is provided by the first control line and the first predetermined voltage is provided by the third control line, and wherein the second memory element is configured to be programmed to the first state and the first memory element is configured to be programmed to the second state when the current pulse is provided by the second control line and the first predetermined voltage is provided by the third control line; and enabling a potential on a common source line to float, wherein a second switching element coupled to the first memory element and the first switching element and a third switching element coupled to the second memory element and the first switching element are coupled to the common source line, and wherein the common source line is coupled to a fourth switching element that selectively couples the second switching element and the third switching element to a ground potential.

13. The method claim 12, further comprising:
providing a second predetermined voltage by a fourth control line coupled to a second gate terminal of the second switching element and a third gate terminal of the third switching element, the second predetermined voltage being configured to turn on the second switching element and the third switching element, wherein a second drain terminal of the second switching element is connected to the first memory element and the first source terminal, wherein a third drain element of the third switching element is connected to the second memory element and the first drain terminal, and wherein a second source terminal of the second switching element and a third source terminal of the third switching element are connected to the common source line.

14. The method of claim 13, wherein the third control line and the fourth control line are wordlines configured to select the differential bit cell based on a row address.

15. The method of claim 12, wherein at least one of the first switching element, the second switching element, or the third switching element is a transistor.

16. The method of claim 12, wherein the first state and the second state are different resistive states.

17. A method comprising:
reading a differential bit cell that includes a first memory element and a second memory element, said reading comprising:
providing a first current pulse by a first control line coupled to the first memory element which is configured to have a first state;
providing a first predetermined voltage by a second control line coupled to a first gate terminal of a first switching element to turn on the first switching element, wherein a first source terminal of the first switching element is connected to the first memory element, and wherein a first drain terminal of the first switching element is connected to the second memory element which is configured to have a second state that is different than the first state; and
providing a second predetermined voltage by a third control line coupled to a second gate terminal of a second switching element and a third gate terminal of a third switching element to turn on the second switching element and the third switching element, wherein a second drain terminal of the second switching element is coupled to the first memory element and the first source terminal of the first switching element, and wherein a third drain terminal of the third switching element is coupled to the second memory element and the first drain terminal of the first switching element; and
providing a first voltage by the first control line, wherein the first voltage is based in part on the first current pulse flowing through a first combination in which the second switching element is coupled in parallel with the first switching element and the third switching element.

18. The method of claim 17, wherein the first state and the second state are different resistive states.

19. The method of claim 17, further comprising:
providing a second current pulse by a fourth control line coupled to the second memory element; and
providing a second voltage by the fourth control line, wherein the second voltage is based in part on the second current pulse flowing through a second combination in which the third switching element is coupled in parallel with the first switching element and the second switching element.

20. The method of claim 19, further comprising:
determining a difference between the first voltage and the second voltage; and
determining a digital value associated with the differential bit cell based on the difference.

* * * * *

UNITED STATES PATENT AND TRADEMARK OFFICE
CERTIFICATE OF CORRECTION

PATENT NO. : 9,218,877 B2  
APPLICATION NO. : 13/924495  
DATED : December 22, 2015  
INVENTOR(S) : Owen Hynes et al.

It is certified that error appears in the above-identified patent and that said Letters Patent is hereby corrected as shown below:

In the claims

In column 17, line 20, in claim 13, delete "method" and insert -- method of --, therefor.

Signed and Sealed this
Twenty-sixth Day of July, 2016

Michelle K. Lee
*Director of the United States Patent and Trademark Office*